United States Patent [19]

Usui et al.

[11] 4,387,398

[45] Jun. 7, 1983

[54] TELEVISION VIDEO SIGNAL DETECTOR

[75] Inventors: Akira Usui, Takatsuki; Toshimitsu Fujimori, Ibaraki, both of Japan

[73] Assignee: Matsushita Electric Industrial Co. Ltd., Osaka, Japan

[21] Appl. No.: 304,949

[22] Filed: Sep. 23, 1981

[30] Foreign Application Priority Data

Sep. 30, 1980 [JP] Japan .................................. 55-137204

[51] Int. Cl.³ .......................... H04B 1/30; H04N 5/44
[52] U.S. Cl. .................................... 358/188; 329/50; 329/123; 455/324; 455/337
[58] Field of Search ................. 358/160, 188, 197, 23; 329/122, 123, 50; 455/324, 337, 204

[56] References Cited

U.S. PATENT DOCUMENTS 3,417,337 12/1968 Prasil ................................ 455/324 X
3,750,029 7/1973 Baars ............................... 358/188 X
4,234,963 11/1980 Hongu ............................. 358/188 X Primary Examiner—Robert L. Richardson
Attorney, Agent, or Firm—Burgess, Ryan and Wayne

[57] ABSTRACT

The video IF signal is applied to a carrier amplifier so that the signal is amplified and limited in amplitude and consequently only the carrier can be derived. The video IF signal is also amplified by a linear amplifier and compensated by a phase compensation circuit in such a way that the relative phase difference between the outputs from the carrier amplifier and linear amplifier can be eliminated. The outputs from the carrier amplifier and linear amplifier are applied to a synchronous detector, whereby the television video signal without any distortion can be derived.

5 Claims, 6 Drawing Figures

| FIG. 5A | FIG. 5B |

TELEVISION VIDEO SIGNAL DETECTOR

BACKGROUND OF THE INVENTION

The present invention relates to a television video signal detector of the type utilizing an artificial synchronous detector.

In the prior art television video signal detector, the video IF signal is applied not only to a carrier amplifier but also to a linear amplifier. The carrier amplifier amplifies the video IF signal and limits its amplitude so that only the carrier can be derived and is applied to a synchronous detector. The linear amplifier amplifies the video IF signal and the amplified signal is applied to the synchronous detector. The television video signal detector of the type described has the defect that a phase difference results between the signals passing through the carrier amplifier and linear amplifier, respectively, so that the detected video signal is distorted.

SUMMARY OF THE INVENTION

The present invention was made to overcome the above and other defects encountered in the prior art television video signal detector.

One of the objects of the present invention is, therefore, to provide a television video signal detector which can provide the video signal without any distortion.

Another object of the present invention is to provide a television video signal detector which is adapted to be fabricated as an integrated circuit.

According to the aspect of the present invention, the video IF signal is applied to a carrier amplifier to be amplified and limited in amplitude so that only the carrier can be derived and is applied to a synchronous detector. The video IF signal is also applied to a linear amplifier and passed through a phase compensation circuit so that the relative phase difference between the outputs from the respective carrier amplifier and linear amplifier can be eliminated when applied to the synchronous detector.

BRIEF DESCRIPTION OF THE DRAWINGS

Same reference numerals are used to designate similar parts throughout the figures.

DETAILED DESCRIPTION OF THE PRIOR ART

Figure 1:
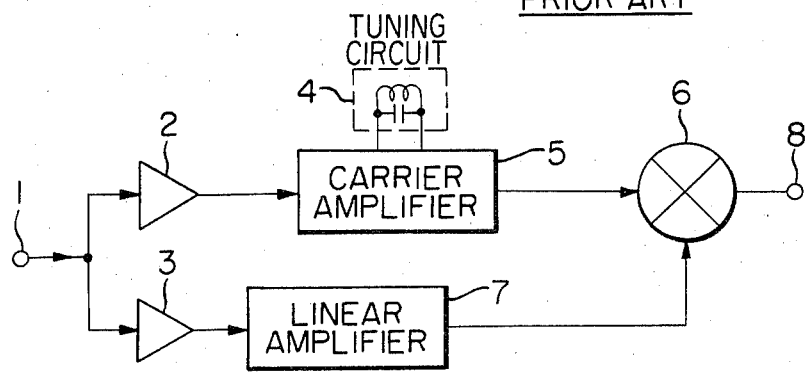
FIG. 1 is a block diagram of a prior art television video signal detector.

In general, the prior art video signal detector comprising an artificial synchronous detector is constructed as shown in FIG. 1. The input signal applied to an input terminal 1 is distributed through buffer amplifiers 2 and 3 to a carrier-limiter amplifier 5 and a linear amplifier 7. The carrier-limiter amplifier 5 which has a tuning circuit 4 tuned to the video carrier limits the amplitude of the input signal and converts the input signal into the video carrier which in turn is applied to a multiplier 6 for synchronous detection. The output from the linear amplifier 7 is also applied to the synchronous detector 6 such as a multiplier and multiplied with the output from the carrier amplifier 5, whereby the detected video signal is derived from an output terminal.

Figure 2:
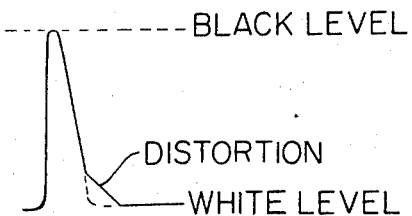
FIG. 2 shows a waveform used for the explanation of the mode of operation thereof.

In this system, the carrier amplifier 5 and the linear amplifier 7 are widely different in gain. That is, as compared with the input signal applied to the linear amplifier 7, the input signal applied to the carrier amplifier 5 is more influenced by the capacitances between the bases and collectors of transistors used in the carrier amplifier 5 so that the output therefrom is much lagged behind in phase. As a result, the detected video signal is distorted as shown in FIG. 2. That is, the trailing edge of a highly modulated part does not drop immediately to the white level, but gradually falls. As a result, on the screen of the cathode-ray tube, smear is caused in a white part adjacent to a black part or a black part is surrounded with a white shade.

In order to solve this problem, the center frequency of the tank or tuning circuit 4 can be shifted, but if it is shifted excessively, the gain at the carrier frequency (58.75 MHz) drops. As a result, the linearity especially of a highly modulated part is varied so that the differential gain and phase characteristics of the detected video signal are degraded.

Figure 3:
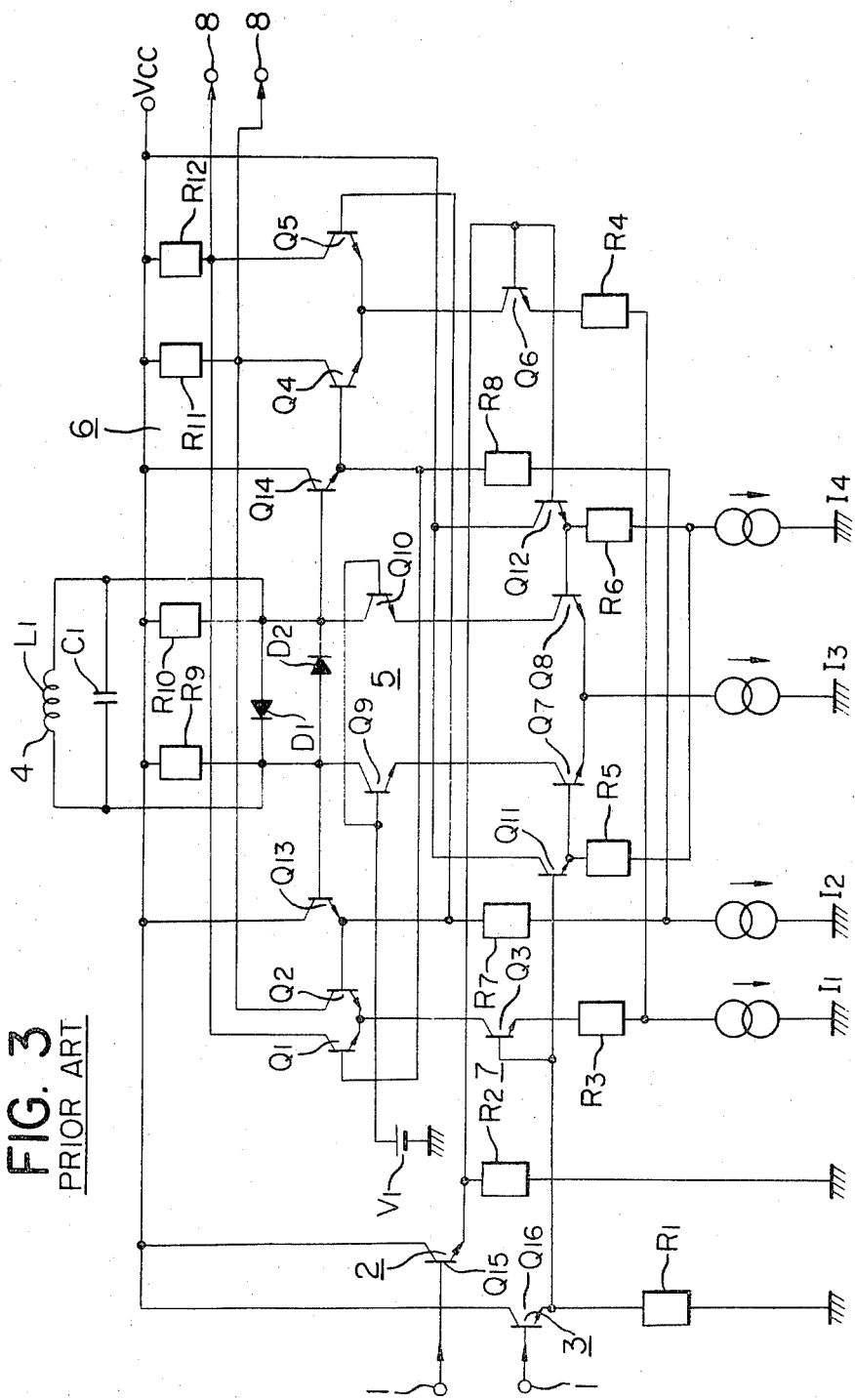
FIG. 3 is a detailed circuit diagram thereof.

The detailed circuit diagram of the television video signal detection system shown in FIG. 1 is illustrated in FIG. 3. Emitter-follower circuits comprising transistors $Q_{15}$ and $Q_{16}$ correspond to the buffer amplifiers 2 and 3, respectively. The carrier amplifier 5 corresponds to a differential amplifier comprising transistors $Q_7$, $Q_8$, $Q_9$ and $Q_{10}$ and limiter-diodes $D_1$ and $D_2$. The multiplier 6 and the linear amplifier 7 correspond to a double-balanced type differential amplifier comprising transistors $Q_1$, $Q_2$, $Q_3$, $Q_4$, $Q_5$ and $Q_6$.

The phase difference described previously is dependent upon the numbers of base and collector stages which the two input signals must pass until they reach the collectors of the transistors $Q_4$ and $Q_5$, respectively. For instance, the carrier amplifier 5 has two stages that is, between $Q_7$ and $Q_8$ and between $Q_2$ and $Q_4$ while the linear amplifier 7 has only one stage that is, between $Q_3$ and $Q_6$. Normally, in the detection stage, the phases of the detections are different from each other in phase angle by 180°, but at the frequency of 58.75 MHz of the video IF signal, the gain-bandwidth product $f_T$ of the transistor cannot be neglected. As a result, the relationship separated in phase by 180° cannot be maintained. In addition, the input to the base of the amplifier 5 varies in level depending upon the modulation degree, so that the relative phase relationship varies also depending upon the modulation degree.

DESCRIPTION OF THE PREFERRED EMBODIMENT

Figure 4:
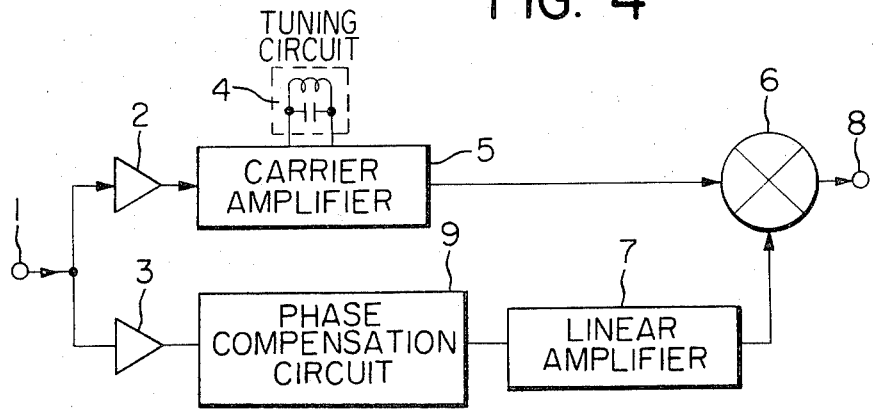
FIG. 4 is a block diagram of a preferred embodiment of the present invention.

A preferred embodiment of the present invention will be now described in detail with reference to FIGS. 4 to 6. Referring first to FIG. 4 illustrating in block diagram of the fundamental construction. The video IF signal is applied to an input terminal and distributed through buffer amplifiers 2 and 3 to a carrier amplifier 5 and a linear amplifier 7 through a phase compensation circuit 9. The carrier amplifier 5 has a tuning circuit 4 and a limiter-diode and the output from the carrier amplifier 5 is applied to a multiplier 6. The output from the buffer amplifier 3 is compensated for phase by the phase compensation circuit 9 and then applied to the linear amplifier 7. The output from the linear amplifier 7 is also applied to the multiplier 6 to be multiplied with the output from the carrier amplifier 5, so that the video signal is detected by the synchronous detection and derived from an output terminal 8.

Figures 5, 5A:
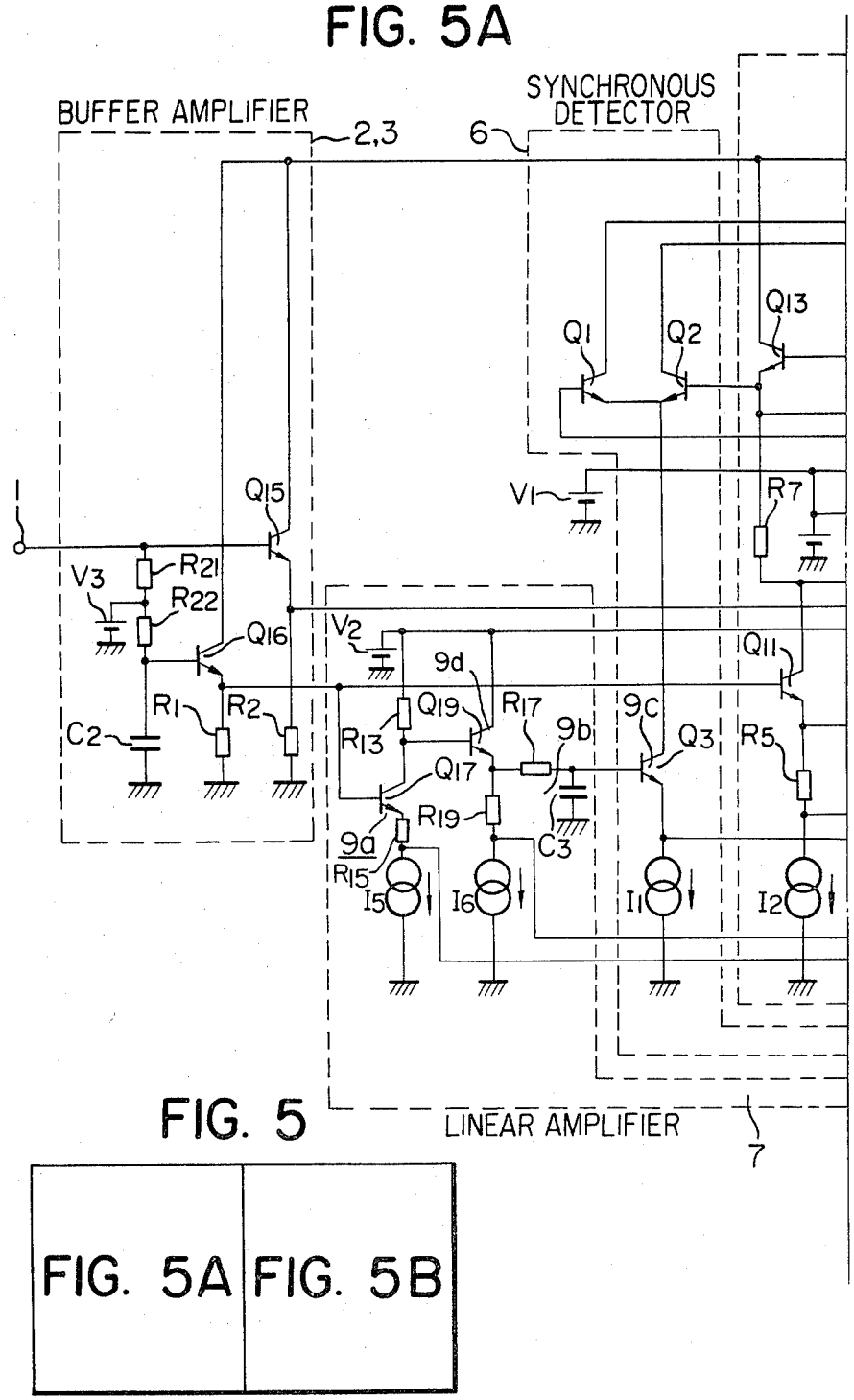
FIG. 5, including 5A and 5B, is a detailed circuit diagram thereof.
Figure 5B:
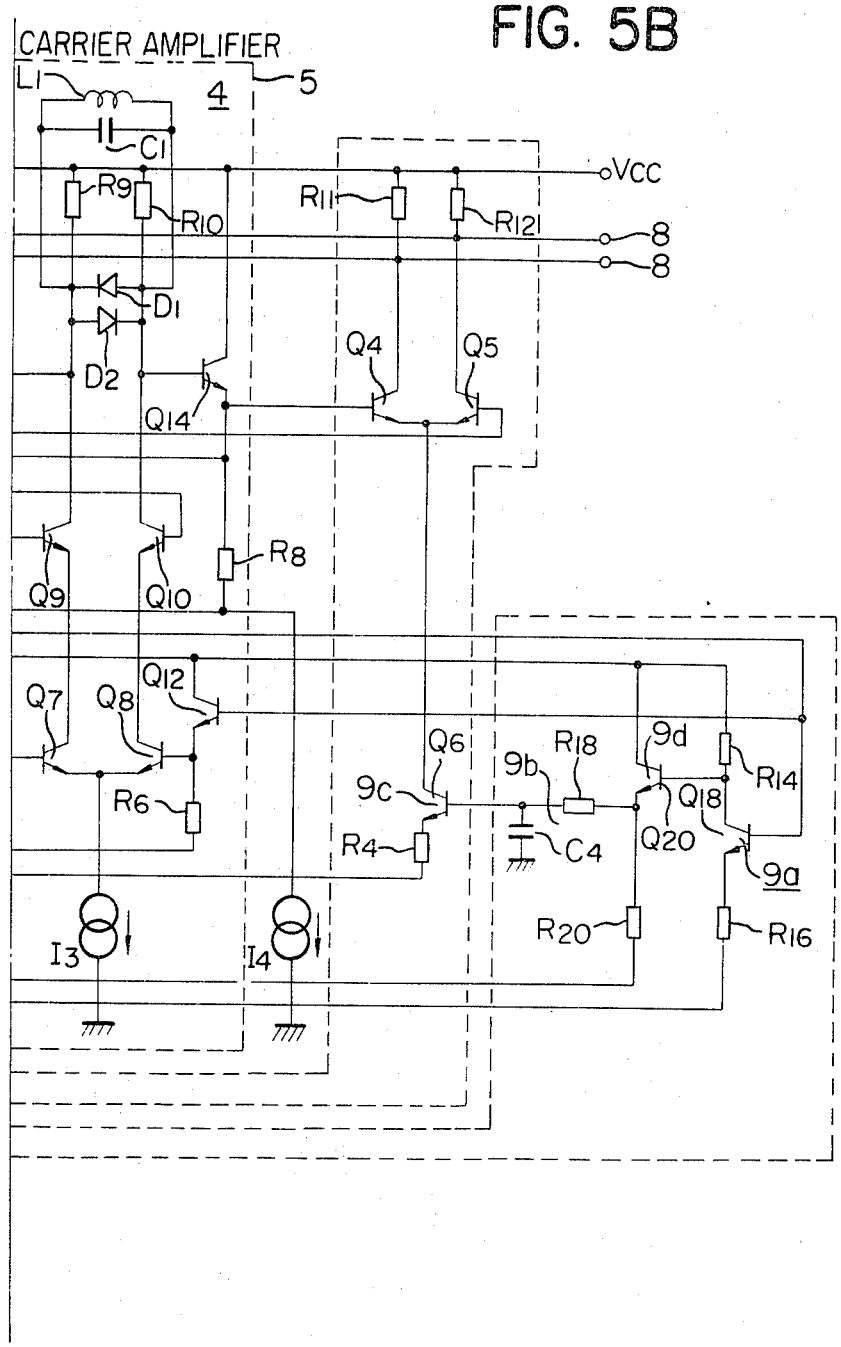

In FIG. 5 is shown in detail a circuit diagram of the preferred embodiment of the present invention. The input signal is divided by the buffer amplifiers 2 and 3 comprising transistors $Q_{15}$ and $Q_{16}$. The output from the buffer amplifier 3 is applied to a linear inverting amplifier 9a comprising transistors $Q_{17}$ and $Q_{18}$ and resistors $R_{13}$, $R_{15}$, $R_{14}$ and $R_{16}$. The main function of the inverting amplifier 9a is to obtain the same phase inversion as in the carrier amplifier channel. The addition of the inverting amplifier 9a can eliminate the variations in relative phase difference due to the modulation degree.

However, the gain of the carrier amplifier 5 is higher than that of the linear amplifier 7 and the values of the collector resistors $R_9$ and $R_{10}$ are higher than those of the collector resistors $R_{13}$ and $R_{14}$, so that there still exists the phase difference between the signals passing through the carrier and linear amplifiers 5 and 7 and consequently the detected video signal is still distorted. Therefore, the collectors of transistors $Q_{17}$ and $Q_{18}$ of the inverting amplifier 9a are connected to the bases, respectively, of emitter-followers $Q_{19}$ and $Q_{20}$. In addition, a phase delay circuit 9b comprising the transistors $Q_{19}$ and $Q_{20}$, resistors $R_{17}$ and $R_{18}$ connected to their emitters, respectively, and capacitors $C_3$ and $C_4$ is inserted. As a result, the video IF signal is so compensated for phase that the relative phase difference between the signals passing through the carrier amplifier 5 and the linear amplifier 7 can be eliminated.

The input signals are then applied through buffer amplifiers 9d comprising transistors $Q_{19}$ and $Q_{20}$ to the bases of transistors $Q_3$ (9c) and $Q_6$ (9c) which are the input terminals of the detector 6.

Therefore, the relative phase difference between the carrier signal applied from the carrier amplifier 5 to the detector 6 and the input signal from the linear amplifier 7, so that the distortions can be eliminated in the synchronous detection by the synchronous detector 6. As a result, the correct video signal can be derived and high-quality images without smear or white shading or edges can be reproduced.

The resistors $R_{17}$ and $R_{18}$ which are connected in series to the emitters, respectively, of the emitter-followers $Q_{19}$ and $Q_{20}$ can be provided by the contact resistances of the emitters of the transistors $Q_{19}$ and $Q_{20}$ when the latter are fabricated as IC elements on a chip. However, if the contact resistances are not sufficient, small resistors can be deposited and connected in series to the emitters of transistors $Q_{19}$ and $Q_{20}$. Since the contact resistances are positively utilized, the arrangement of IC elements can be much simplified and consequently a high yield can be ensured. The inventors conducted the experiments for utilizing the floating capacitances in the circuit as the capacitors $C_3$ and $C_4$ in the phase delay circuits 9b and found out that in this case, the optimum values of the emitter resistors $R_{17}$ and $R_{18}$ are between 20 and 70 $\Omega$.

In summary, according to the present invention, in the video signal detector of the type comprising an artificial synchronous detector, the phase difference can be eliminated between the video carrier reproduced by the carrier amplifier and the video IF signal derived from the linear amplifier so that the video signal with the correct waveform and without any distortion can be obtained. As a result, high-quality images without any smear or white shade or edge can be reproduced. In addition, the emitter-followers are used in the phase compensation circuit and the contact resistances of the emitters of transistors are used partly or wholly as the emitter resistors in the phase delay circuit. As a consequence, the construction of the television video signal detector in accordance with the present invention can be easily fabricated as an IC.

What is claimed is:

1. A video signal detector comprising:
   (a) an input terminal for receiving a video IF signal;
   (b) a carrier amplifier comprising
      a plurality of transistors for amplifying said video IF signal, a tuning circuit coupled to said amplifier and comprising a plurality of transistors, said tuning circuit being tuned to a video intermediate frequency, and
      a limiter coupled to said tuning circuit so as to limit the amplitude of the amplified video IF signal, thereby producing a video intermediate frequency carrier signal;
   (c) coupling means for interconnecting said input terminal for receiving the video IF signal and said carrier amplifier;
   (d) a linear amplifier which has a plurality of transistor amplifiers equal in number to those of said carrier amplifier and which amplifies the video IF signal;
   (e) a phase compensation circuit which imparts the phase variations or shifts to the video IF signal to the same extent as the undesired phase variations or shifts of the carrier signal derived from said carrier amplifier;
   (f) series-connecting means which connects said linear amplifier in series with said phase compensation circuit to form a series-connected circuit,
   (g) second coupling means for connecting the input side of the series-connected linear amplifier and phase compensation circuit to said input terminal for receiving the video IF signal;
   (h) a synchronous detector for synchronously demodulating the video IF signal by means of the carrier signal obtained from said carrier amplifier, said video IF signal being in phase with the carrier signal derived from said series-connected circuit, thereby converting the video IF signal into a television video signal;
   (i) third coupling means which couples the input terminal of said synchronous detector to the output terminal of said carrier amplifier and also couples the video input signal terminal to an output terminal of said series-connected circuit;
   (j) an output terminal connected to said synchronous detector, at which terminal a detected or demodulated television video signal is provided; and
   (k) fourth coupling means for coupling the output terminal connected to said synchronous detector to a television video signal output terminal.

2. A video signal detector as set forth in claim 1, wherein said phase compensation circuit comprises:
   (a) a transistor;
   (b) a means for applying the video IF signal to the base of said transistor;
   (c) coupling means for coupling the collector of said transistor to a voltage source;
   (d) an emitter resistor connected in series between the emitter of said transistor and a reference potential point;

(e) a resistor interconnected between said emitter of said transistor and an output terminal of said phase compensation circuit; and (f) a capacitor connected to said resistor (e) and said reference potential point and cooperating with said resistor (e) to form a phase delay circuit.

3. A video signal detector as set forth in claim 2, wherein said emitter resistor includes:

(a) the internal emitter-contact resistance of said transistor, and (b) another resistance externally coupled to said transistor.

4. A video signal detector as set forth in claim 2, wherein part of the capacitance of said capacitor consists of (i) said resistor (e) and the distributed capacitance of a line interconnecting said resistor (e) and the output terminal of said phase compensation circuit and (ii) the distributed capacitance of a line between said reference potential point and said voltage source.

5. A video signal detector as set forth in claim 1, wherein said carrier amplifier comprises:

a differential amplifier comprising a transistor pair, the emitters of which are connected to each other;

means for applying said video IF signal to said transistor pair;

said tuning circuit which is interconnected between the collectors of said transistor pair and which is tuned to the frequency of said video IF signal;

a diode pair which serves as a limiter, interconnected between the collectors of said transistor pair in back-to-back relationship; and means for deriving the carrier signal from the collector circuit of said transistor pair.

* * * * *